US006294839B1

(12) United States Patent
Mess et al.

(10) Patent No.: US 6,294,839 B1
(45) Date of Patent: Sep. 25, 2001

(54) APPARATUS AND METHODS OF PACKAGING AND TESTING DIE

(75) Inventors: Leonard E. Mess, Boise; David J. Corisis; Walter L. Moden, both of Meridian; Larry D. Kinsman, Boise, all of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/385,766

(22) Filed: Aug. 30, 1999

(51) Int. Cl.[7] .......................... H01L 23/48; H01L 23/52; H01L 23/40
(52) U.S. Cl. .................. 257/777; 257/723; 257/686; 257/778; 257/779; 257/780; 257/784; 257/774
(58) Field of Search .................................... 257/777, 723, 257/686, 778, 779, 780, 784, 774

(56) References Cited

U.S. PATENT DOCUMENTS

| | | |
|---|---|---|
| 5,088,190 | 2/1992 | Malhi et al. . |
| 5,528,222 | 6/1996 | Moskowitz et al. . |
| 5,541,525 | 7/1996 | Wood et al. . |
| 5,566,441 | 10/1996 | Marsh et al. . |
| 5,600,175 | 2/1997 | Orthmann . |
| 5,607,818 | 3/1997 | Akram et al. . |
| 5,633,122 | 5/1997 | Tuttle . |
| 5,634,267 | 6/1997 | Farnworth et al. . |
| 5,656,551 | 8/1997 | Corbett et al. . |
| 5,682,143 | 10/1997 | Bradley et al. . |
| 5,733,800 | 3/1998 | Moden . |
| 5,767,564 * | 6/1998 | Kunimatsu et al. .................. 257/532 |
| 5,784,260 | 7/1998 | Fuller, Jr. et al. . |
| 5,811,879 | 9/1998 | Akram . |
| 5,818,698 | 10/1998 | Corisis . |
| 5,875,100 | 2/1999 | Yamashita . |
| 5,898,217 | 4/1999 | Johnston . |
| 5,963,429 * | 10/1999 | Chen ..................................... 361/764 |

FOREIGN PATENT DOCUMENTS

| | | |
|---|---|---|
| 0231937B1 | 2/1987 | (EP) . |
| 0595549A2 | 10/1993 | (EP) . |
| 02000252787-A * | 9/2000 | (JP) . |

* cited by examiner

Primary Examiner—Minh Loan Tran
Assistant Examiner—Luan Thai
(74) Attorney, Agent, or Firm—Dorsey & Whitney LLP

(57) ABSTRACT

Apparatus and methods of packaging and testing die. In one embodiment, a stacked die package includes a packaging substrate having a first surface with a recess disposed therein and a plurality of conductive leads coupled thereto, a first die attached to the packaging substrate within the recess and having a plurality of first bond pads electrically coupled to at least some of the conductive leads, and a second die attached to the first die and having a plurality of second bond pads that are electrically coupled to at least some of the conductive leads. When the stacked die package is engaged with, for example, a circuit board, the first surface of the packaging substrate is proximate the circuit board so that the packaging substrate at least partially encloses and protects the first and second die. The properties and dimensions of the packaging substrate are tailored to optimize the operational environment of the die, including improving thermal dissipation and enhancing performance of the die. In an alternate embodiment, the packaging substrate comprises an electrically conductive substrate and an electrically insulative material is formed between the conductive leads and the packaging substrate. In another embodiment, the first bond pads are electrically coupled to the conductive leads by wire-bonding. Alternately, the first bond pads are in direct contact with the conductive leads in a flip chip arrangement. In another embodiment, the die is sealed within an encapsulating layer to protect the first and second die.

16 Claims, 8 Drawing Sheets

APPARATUS AND METHODS OF PACKAGING AND TESTING DIE

TECHNICAL FIELD

The present invention relates to apparatus and methods of packaging and testing die for use in, for example, chip scale packages and other similar devices.

BACKGROUND OF THE INVENTION

Conventional packaging of die in microelectronic devices involves two levels of packaging. FIG. 1 shows a first level of packaging of a die package 40 in accordance with the prior art. In this example, a die (or integrated circuit) 20 is attached to a lead frame 22 having a plurality of conductive leads 24 formed thereon. The die 20 is typically attached with a layer of adhesive epoxy or glue. Bonding pads 26 on the die 20 are connected by bonding wires 28 to respective contact pads 30 on the lead frame 22, a technique commonly known as wire-bonding. The contact pads 30 are electrically coupled to an inner end of each conductive lead 24. In this representative example, each conductive lead 24 has an outer end that terminates in a connecting pin 32. The die 20 and lead frame 22 are then encapsulated by a cover 34, thus constituting the first level of packaging. In a second level of packaging, the encapsulated die and lead frame may be mounted to an electronics device, such as by inserting the connecting pins 32 into associated sockets on a printed circuit board and securing the pins in place using solder reflow techniques.

Recently, die have been mounted directly to a substrate, such as a printed circuit board, thus eliminating the lead frame and the first level of packaging. Mounting of the die 20 directly to a circuit board is generally referred to as chip-on-board (COB) packaging. For example, FIG. 2 shows the die 20 mounted directly to a circuit board 40 in a COB or "flip chip" packaging arrangement. In this arrangement, the bonding pads 26 are located on a bottom surface of the die 20. The circuit board 40 has a set of terminals or conductive bumps 42 on one surface. As shown in FIG. 2, the die 20 is mounted with the bonding pads 26 of the die 20 facing the surface of the printed circuit board 40 to which the die 20 is being mounted such that the bonding pads 26 make direct contact with the terminals 42. Thus, the bonding wires 28 and lead frame 22 are eliminated.

It is customary to provide a layer of material known as a glob top or encapsulating layer 44 over the die 20 to hermetically seal the die 20. The glob top 44 serves as a chemical insulator protecting the die 20 from humidity, oxidation, and other harmful elements. The glob top 44 also protects the die 20 mechanically and relieves mechanical stress in the die 20.

It is also known to stack die on top of another die to save space on the printed circuit board. For example, FIG. 3 shows a packaging arrangement having an inner die 50 mounted in a flip chip arrangement on the circuit board 40 such that the bonding pads 26 of the inner die 50 are in direct contact with the conductive terminals 42 on the circuit board 40. An outer die 52 is attached to the inner die 50. Bonding wires 28 extend from a set of second bonding pads 54 on the outer die 52 to a set of second terminals 56 on the circuit board 40. A glob top 44 is then applied over the stacked die to hermetically seal and protect the die 50, 52.

A conventional method of testing the stacked die 50, 52 arrangement is to test the package after it has been completely assembled. Testing of the die prior to packaging is typically limited to spot-checking of a random sample of the die while the die are attached to the wafer. FIG. 4 shows a conventional method 60 of assembling and testing stacked die on a printed circuit board (PCB). In a first step 62, the inner die 50 is attached to the PCB 40 with the contact pads 26 of the inner die 50 in contact with the terminals 42. The outer die 52 is then attached to the inner die 50 in a second step 64, and the glob top is applied to encapsulate the die in a third "sealing" step 65.

In a fourth "testing" step 66, input signals are systematically applied to the package to test all or some aspects of component performance, including speed, functionality, open circuits, shorts, and burn-in testing. In a fifth "determination" step 68, it is determined whether the package has performed the tests successfully. If so, the assembly and test method is complete 70.

If the package has not performed the tests successfully, it is determined whether the package has previously been reworked 72. If the package has been previously reworked but continues to fail the tests, the entire package is discarded in a "rejection" step 74, including the inner die, the outer die, and in some cases even the PCB. If the package has not been previously reworked, however, the package is reworked 76, and the package is returned to the testing step 66 for evaluation.

Although successful results have been achieved using the above-referenced die packages, and methods of assembling and testing such die packages, certain disadvantages have been encountered. For example, because the glob top 44 is designed to protect the die from environmental and mechanical stress, the materials used for the glob top are typically poor thermal conductors. Due to relatively poor heat dissipation through the glob top, the die or the PCB may become hotter than desirable, particularly for stacked die or high-power die applications.

Furthermore, because the conventional method of testing the die package involves testing after the inner die has been attached to the PCB and the outer die has been attached to the inner die, if a package does not pass a test successfully, the stacked die and PCB package must undergo a time-consuming and costly rework procedure, or must be discarded entirely. This is particularly true if the testing is performed after the glob top has been applied.

SUMMARY OF THE INVENTION

The present invention is directed to apparatus and methods of packaging and testing die for use in, for example, chip scale packages and other similar devices. In one aspect of the invention, a stacked die package comprises a packaging substrate including a first surface having a recess disposed therein and a plurality of conductive leads coupled thereto, a first die attached to the packaging substrate within the recess and having a plurality of first bond pads, and a second die attached to the first die and having a plurality of second bond pads, the first and second bond pads being electrically coupled to at least some of the conductive leads. When the stacked die package is engaged with, for example, a circuit board, the first surface of the packaging substrate is proximate the circuit board so that the packaging substrate at least partially encloses and protects the first and second die. The properties and dimensions of the packaging substrate are tailored to optimize the operational environment of the die, including improving thermal dissipation and enhancing performance of the die. In an alternate aspect, the packaging substrate comprises an electrically-conductive substrate and an electrically insulative layer is formed between the conductive leads and the packaging substrate.

In another aspect of the invention, the first bond pads are electrically coupled to the conductive leads by wire-bonding. Alternately, the first bond pads are in direct contact with the conductive leads in a flip chip arrangement. In another aspect, the first and second die are sealed within an encapsulating layer for protection.

A method of packaging and testing a die package in accordance with the invention includes testing a die having a plurality of bond pads formed thereon, determining that the die has tested successfully, providing a packaging substrate including a first surface having a recess formed therein and a plurality of conductive leads formed thereon, attaching the die to the packaging substrate within the recess and with the bond pads electrically coupled to at least some of the conductive leads to form the die package, and testing the die package. By integrating the testing and packaging of the die package, overall efficiency and yield is improved.

In another aspect of the invention, a method of packaging and testing includes determining that the die package has not previously been reworked. Alternately, a method includes reworking the die package. In another alternate aspect, a method includes determining that the die package is salvageable. If so, the die package may be salvaged. Alternately, a method includes sealing the die in an encapsulating layer.

An embodiment of a method of packaging and testing a stacked die package in accordance with the invention includes testing a first die having a plurality of first bond pads formed thereon, determining that the first die has tested successfully, testing a second die having a plurality of second bond pads formed thereon, determining that the second die has tested successfully, attaching the second die to the first die, providing a packaging substrate including a first surface having a recess formed therein and a plurality of conductive leads formed thereon, attaching the first die to the packaging substrate within the recess and with the first and second bond pads electrically coupled to at least some of the conductive leads to form the stacked die package, and testing the stacked die package.

DETAILED DESCRIPTION OF THE INVENTION

The following description is generally directed toward apparatus and methods of packaging and testing die for use in, for example, chip scale packages and other similar devices. Many specific details of certain embodiments of the invention are set forth in the following description and in FIGS. 5–9 to provide a thorough understanding of such embodiments. One skilled in the art, however, will understand that the present invention may have additional embodiments, or that the present invention may be practiced without several of the details described in the following description.

Figure 5:
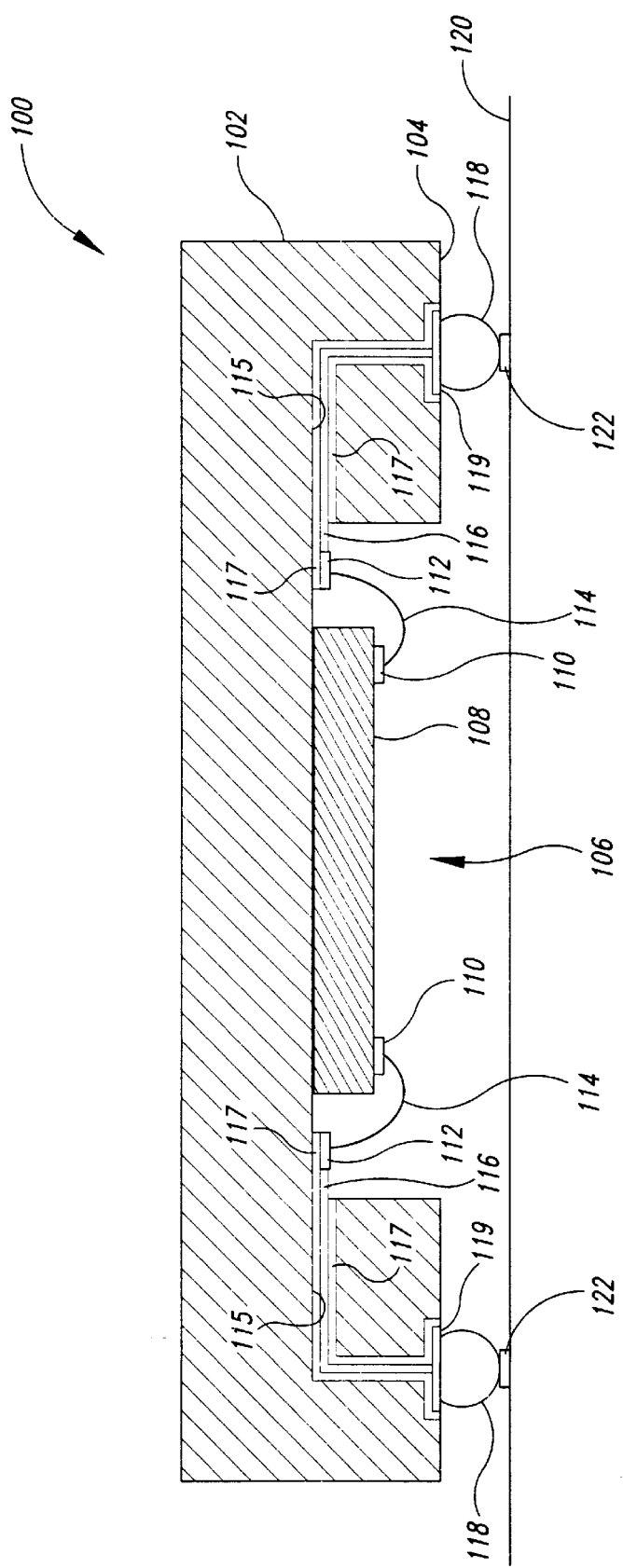
FIG. 5 is a side cross-sectional view of a die package in accordance with an embodiment of the invention.

FIG. 5 is a side cross-sectional view of a die package 100 in accordance with an embodiment of the invention. In this embodiment, the die package 100 includes a packaging substrate 102 with a lower surface 104 having a recess 106 disposed therein. The packaging substrate 102 of the die package 100 may be any suitable material, including a thermally conductive material, such as metal.

A die 108 having a set of bond pads 110 is disposed within the recess 106 and attached to the packaging substrate 102. The die 108 may be attached using a layer of adhesive epoxy or tape, or may be thermally-bonded (e.g. eutectically bonded), or may be attached by any other suitable attachment mechanism. A corresponding set of contact pads 112 are attached to the packaging substrate 102. In this embodiment, the contact pads 112 are located within the recess 106. A bond wire 114 electrically couples each bond pad 110 to a corresponding contact pad 112 using conventional wire-bonding methods.

Figure 2:
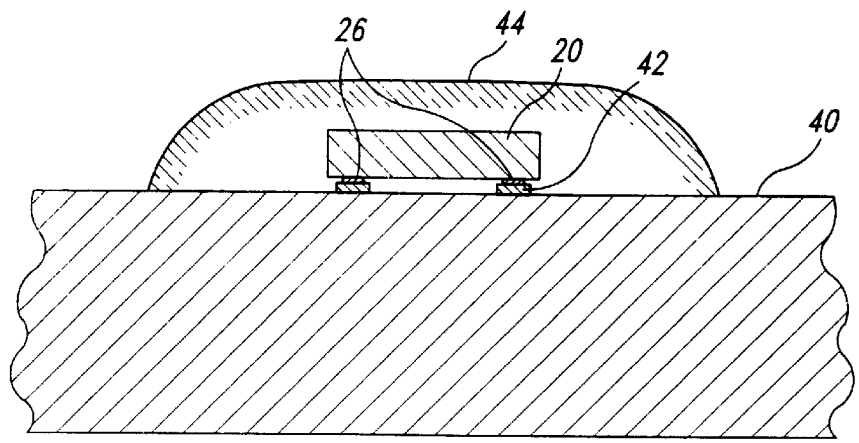
FIG. 2 is a side cross-sectional view of a chip on board package in accordance with the prior art.
Figure 3:
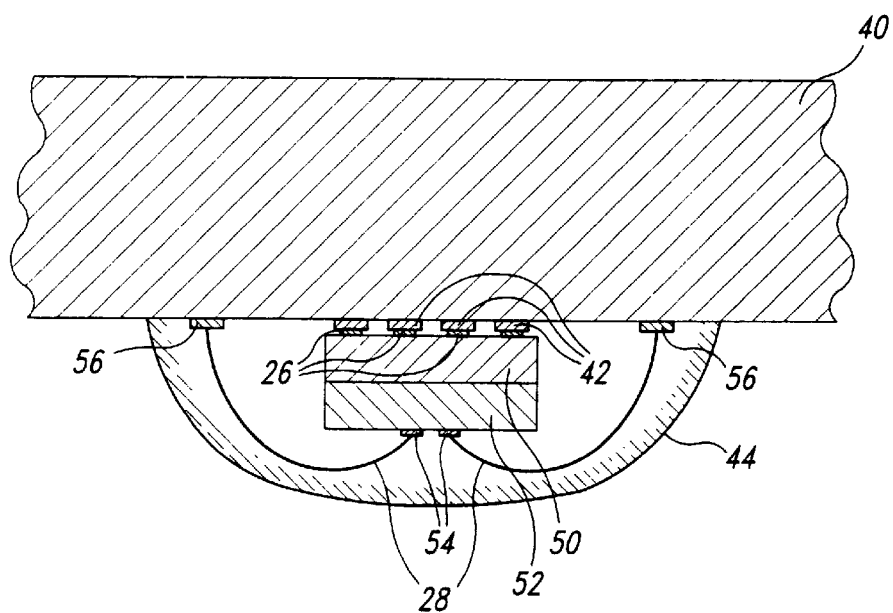
FIG. 3 is a side cross-sectional view of a stacked die package in accordance with the prior art.

One may note that the bond pads may be electrically coupled with the contact pads in a variety of ways, such as by tape automated bonding (TAB), microbump bonding, or flip chip bonding. Furthermore, although not shown in FIG. 5, the die 108 may be sealed within an encapsulating layer, such as the glob top 44 layer of the prior art die packages shown in FIGS. 2 and 3.

In the die package 100, a set of via 115 are formed in the substrate 102. Conductive leads 116 are formed within the via 115. An electrically insulative layer 117 may be formed about each conductive lead 116 between the lead and the walls of the via 115, electrically insulating the conductive lead 116 from the substrate 102. Each conductive lead 116 has an inner end proximate to the recess 106 coupled to a contact pad 112. As used in this application, the inner ends of the conductive leads 116 being "proximate" the recess 106 includes the condition where the conductive leads 116 are at least partially within the recess 106, as shown in FIG. 5.

Each conductive lead 116 also includes an outer end coupled to a ball pad 117 upon which may be formed a solder ball (or bump) 118. The solder balls 118 are then coupled with a corresponding set of terminals 122 of an electrical circuit (e.g. a printed circuit board 120) by any conventional method, such as, for example, by solder reflow techniques. Alternately, some other type of coupling device may be used instead of solder balls. For example, the solder balls 118 may be replaced with connecting pins (FIG. 1) that engage receptacles on the printed circuit board 120.

Throughout the following discussion, die packages are described as being attached to the printed circuit board 120. It is understood, however, that the die packages may be coupled with any number of suitable devices, including test carriers, other electronic components, die packages, or electrical circuits. To simplify the following discussion, however, the die packages will be described as being attached to or engageable with a printed circuit board, allowing the reader to focus on the inventive aspects of the packaging and testing of the die.

Figure 1:
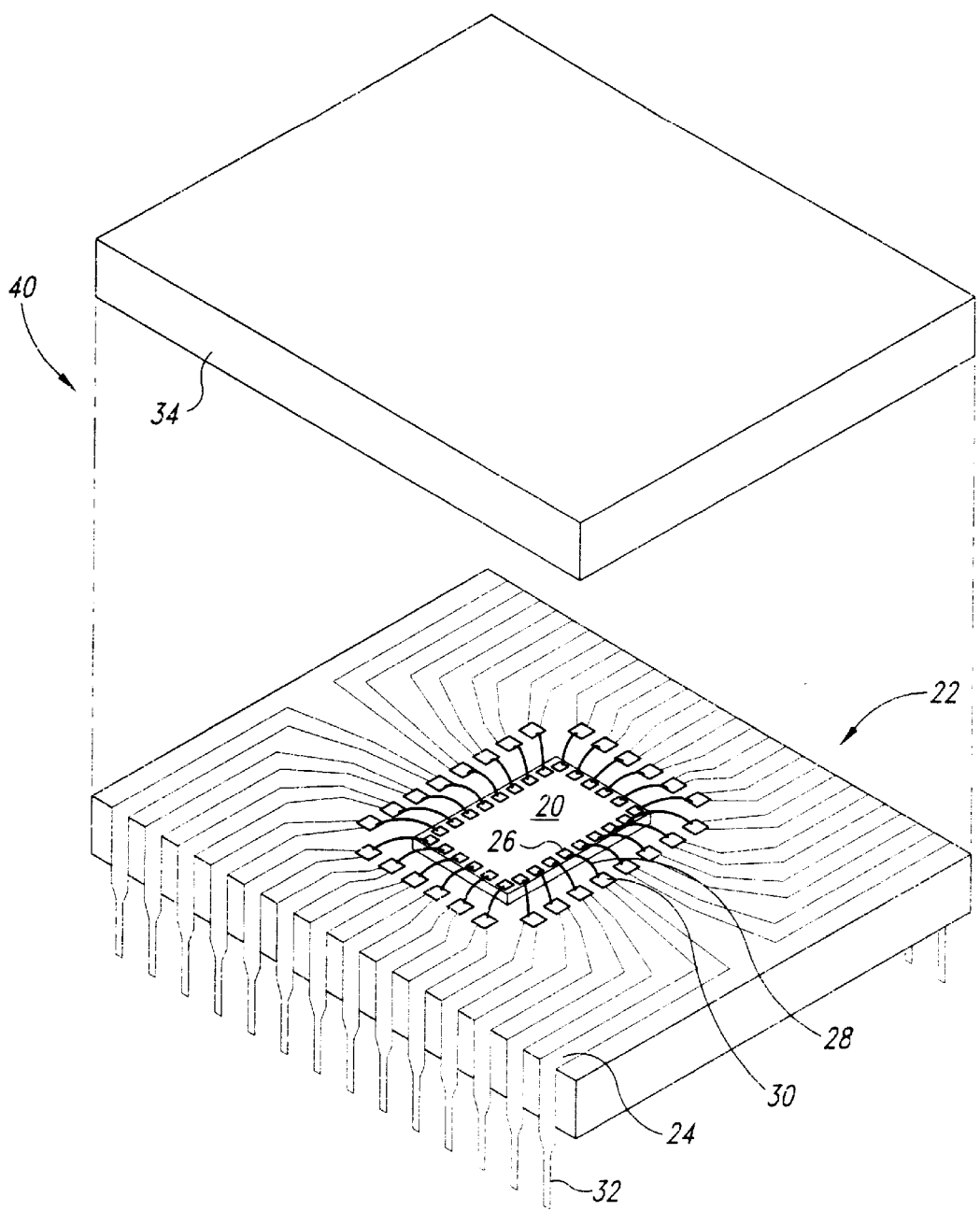
FIG. 1 is an isometric partially exploded view of a die and a lead frame package in accordance with the prior art.

One advantage of the die package 100 is that the packaging substrate 102 serves as both a lead frame and a protective cover for the die 108. Two of the components of the conventional die package shown in FIG. 1 are therefore combined into a single element (i.e., the packaging substrate 102) with an associated reduction in the cost of packaging the die.

Also, because the packaging substrate 102 may be a thermally conductive material, improved cooling characteristics are achieved over prior art die packages. The dimensions and thermal properties of the substrate 102 may be tailored to the particular die 108, or the anticipated operational characteristics thereof, in order to optimize the operational environment and extend the life of the die 108. By proper adjustment of the mass, surface area, conductivity, reflectivity, etc. of the packaging substrate 102, for example, the dissipation of heat away from the die 108 can be better regulated and controlled, particularly for high-power die applications. For a metallic or other electrically conductive packaging substrate 102, the electrically insulative layer 117 may be formed about the conductive leads 116 to electrically insulate to prevent electrical shorts. If the packaging substrate 102 is not electrically conductive, the insulative layer 117 may be eliminated, and the conductive leads 116 may be formed in the via 115 in contact with the packaging substrate 102.

Figure 6:
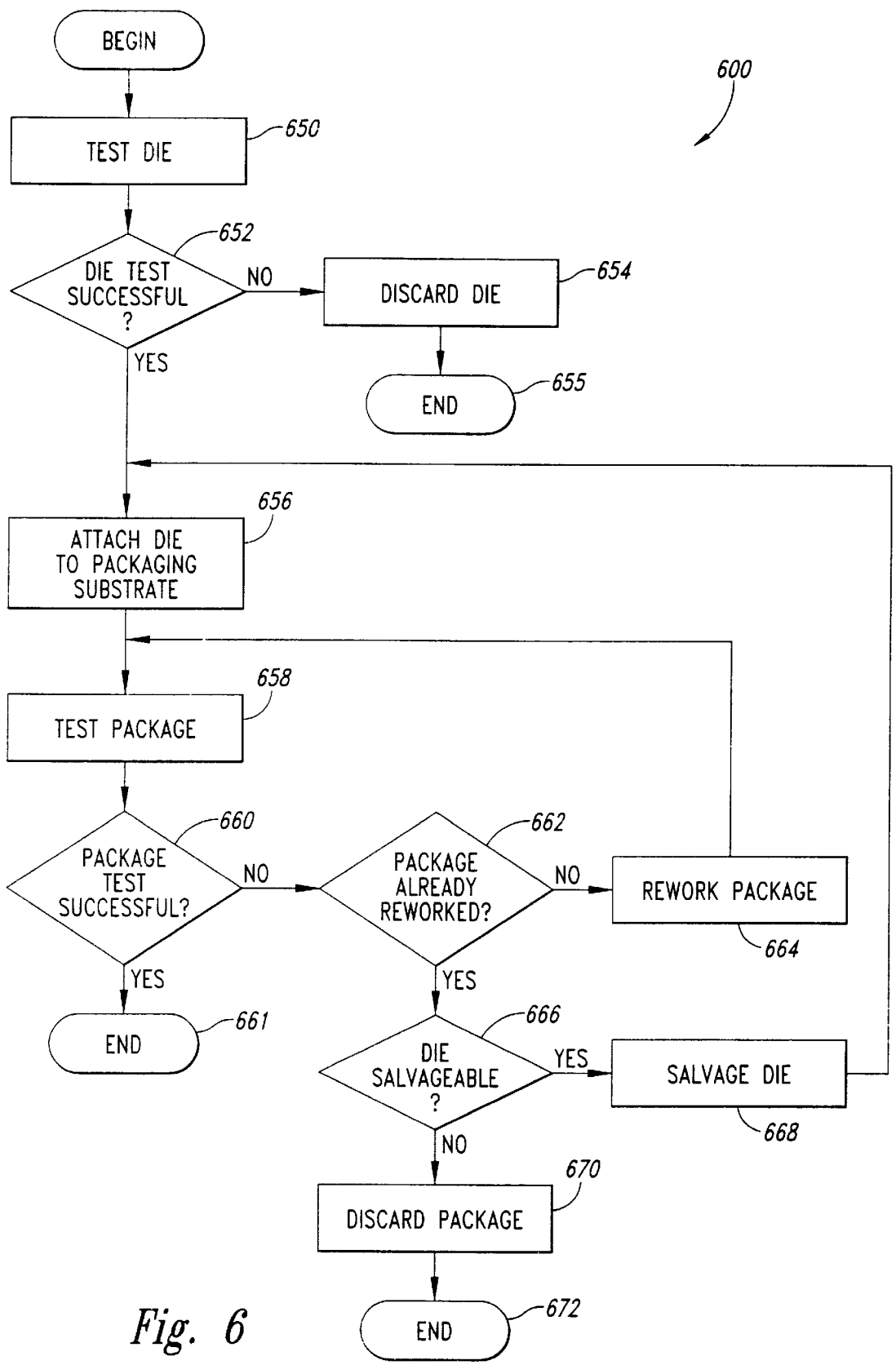
FIG. 6 is a flowchart representation of a method of packaging and testing of the die package of FIG. 5 in accordance with an embodiment of the invention.

FIG. 6 shows a method of packaging and testing 600 of the die package 100 of FIG. 5 in accordance with an embodiment of the invention. As shown in FIG. 6, the die package 100 undergoes an integrated process of testing and packaging. In a first testing step 650, the die 108 may be subjected to a battery of tests, such as speed, functionality, continuity, and burn-in tests. Next, it is determined whether the die tested successfully 652. If the die does not test successfully, it is discarded 654 and the process of packaging the die is ended 655.

If the die does test successfully, the die is attached to the packaging substrate in an attachment step 656. After the attachment step, an abbreviated test 658 is performed on the die package, including, for example, continuity testing. It is then determined whether the die package tested successfully 660. If the die package tests successfully, the process of packaging and testing of the die is complete 661.

If the die package does not test successfully, it is determined whether the die package have already been reworked 662. If not, the die package is reworked 664, and the die package is returned for testing 658. If the die package has already been reworked, however, it is determined whether the die is salvageable 666. If the die is salvageable, it is salvaged by removing the die from the packaging substrate 668, and the die is returned to the step of attaching the die to a packaging substrate 656. The old packaging substrate may be re-attached and tested with a different die, or discarded. If the die is not salvageable, the die package is discarded 670 and the process of packaging the die is ended 672.

The method of packaging and testing 600 of the die package advantageously improves the efficiency of the packaging and testing by integrating testing steps into the packaging process. Because the die is initially tested independently from the packaging substrate, if the die fails a test, the labor involved in packaging the bad die is saved. Also, diagnostic interpretation of the test results is simplified because the test failure can be immediately associated with the bad die.

Similarly, the method 600 improves the overall efficiency of the testing of the die package. Since the die has been subjected to a battery of die-related tests (speed, functionality, etc.) the complexity of the testing of the die package is substantially reduced. Test failures of the die package are therefore more easily and rapidly diagnosed as being associated with the attachment of the die with the packaging substrate. The amount of diagnostic work and die package reworking is reduced, and overall, the testing process is more efficient than the prior art method described above.

Figure 7:
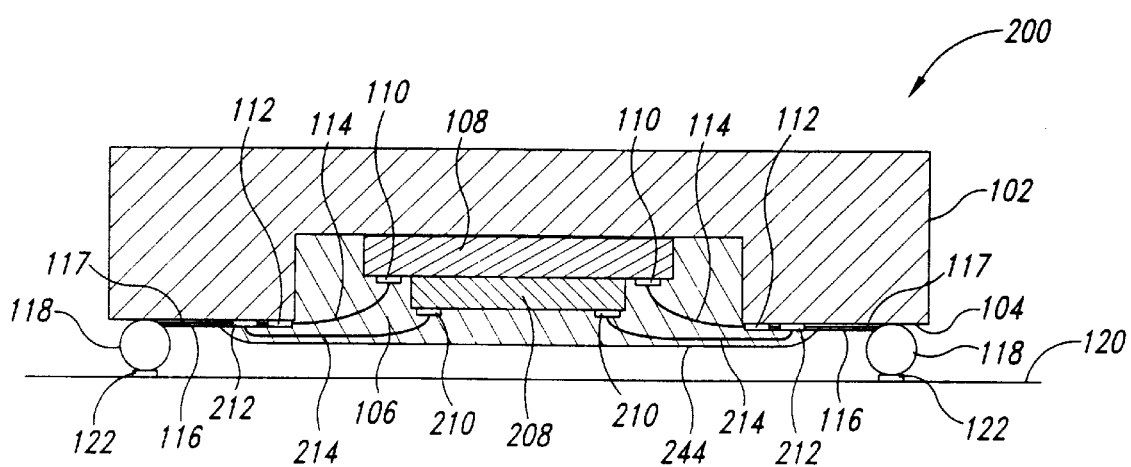
FIG. 7 is a side cross-sectional view of a stacked die package in accordance with an alternate embodiment of the invention.

FIG. 7 is a side cross-sectional view of a stacked die package 200 in accordance with an alternate embodiment of the invention. The stacked die package 200 is similar to the previously described embodiment except that a second (or outer) die 208 is attached to the first (or inner) die 108 and partially disposed within the recess 106. As described above, the bond pads 110 of the first die 108 are connected by first bond wires 114 to corresponding first contact pads 114 on the lower surface 104 of the substrate 102. In this embodiment, however, the first contact pads 112 are not disposed within the recess 106, but rather, are proximate the recess 106 on the lower surface 104 of the packaging substrate.

As shown in FIG. 7, the second die 208 has a set of contact pads 210 that are electrically coupled by second bond wires 214 to a set of second contact pads 212 located on the lower surface 104. An encapsulating layer 244 encompasses the die, bond pads, and bond wires. Conductive leads 116 connect each of the first and second contact pads 112, 212 to corresponding solder balls 118. The solder balls 118 are then coupleable with terminals 122 on the printed circuit board 120 as described above.

The stacked die package 200 advantageously provides the improved thermal dissipation characteristics described above, as well as the recognized advantages of economical use of surface space on the printed board afforded by the stacking of the die. For an electrically conductive packaging substrate 102, an electrically insulative layer 117 may be formed between the conductive leads 116 and the lower surface 104, as shown in FIG. 7. For example, the conductive leads 116 may be mounted to the lower surface 104 on the electrically insulative layer 117 (FIG. 5) such as, for example, an insulative tape material using conventional tape automated bonding (TAB) techniques, to prevent electrical shorts. Alternately, some (or all) of the conductive leads 116 may be disposed within via 115 formed within the packaging substrate 102 (as shown in FIG. 5), or for an electrically insulative packaging substrate 102, the electrically insulative layer 117 may be eliminated.

Also, although the encapsulating layer 244 of the stacked die package 200 may be eliminated, the advantages of a hermetically sealed die may be realized in a die package in accordance with the invention that also offers improved thermal dissipation characteristics over prior art die packages. Because the die are attached to the packaging substrate which has a relatively large surface area facing away from the printed circuit board, improved thermal dissipation is achieved for die packages having single or multiple die that are protected by an encapsulating layer 244.

Figure 8:
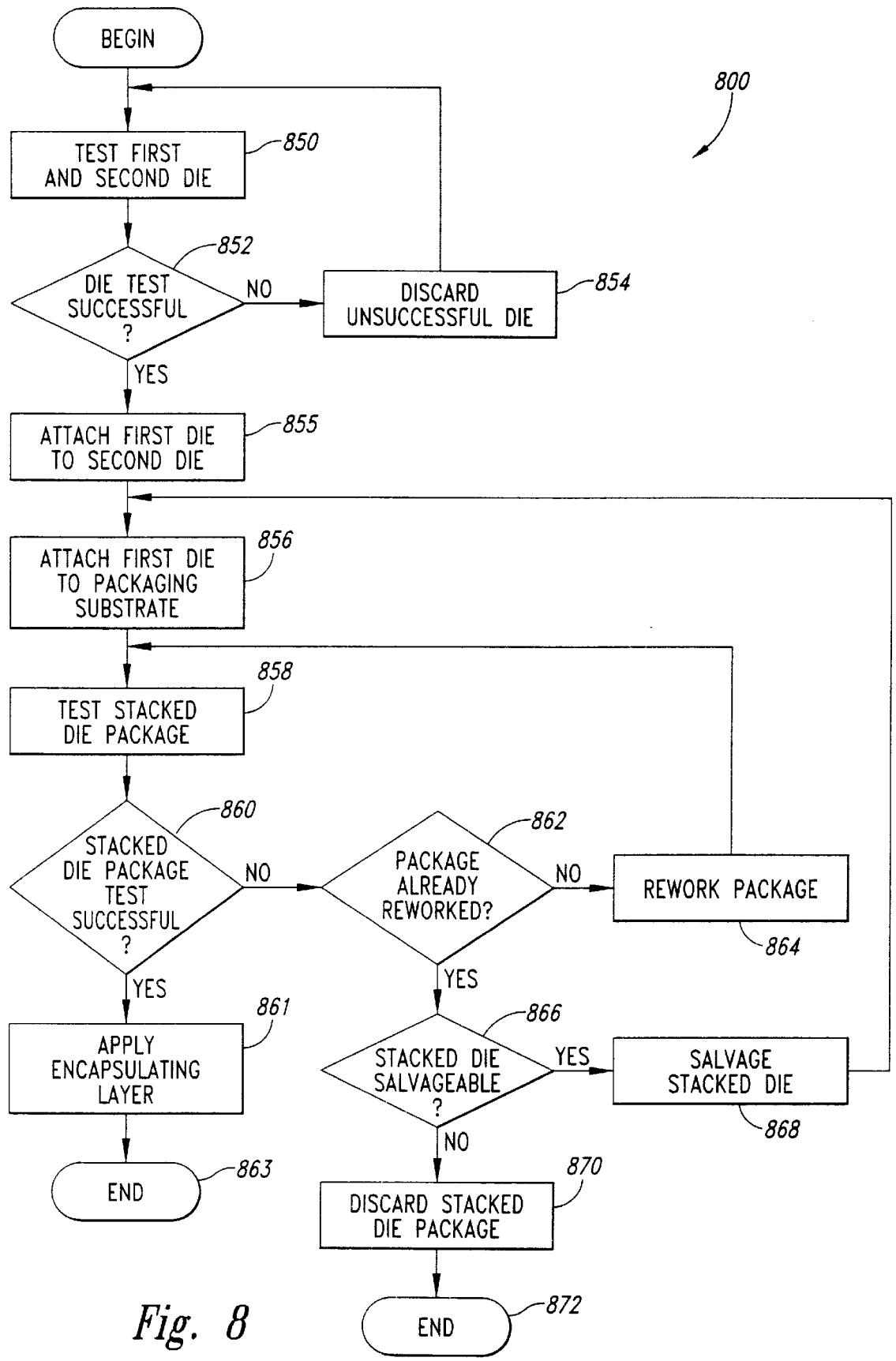
FIG. 8 is a flowchart representation of a method of packaging and testing of the stacked die package of FIG. 7 in accordance with an embodiment of the invention.

FIG. 8 shows a method of packaging and testing 800 of the stacked die package 200 of FIG. 7. In this embodiment, the method 800 begins by testing 850 of the first and second die. The testing of the individual die is preferably rigorous and comprehensive. In a determination step 852 it is determined whether the first and second die tested successfully. If not, the unsuccessful die is discarded 854, and the method returns to the die testing step 850 until both die are successfully tested.

After both die test successfully, the first and second die are attached together 855. The first die is then attached 856 to the packaging substrate within the recess 106 to form the stacked die package 200. Alternately, the first die may be attached to the packaging substrate prior to the attachment of the first die to the second die. Next, the stacked die package is tested 858. Depending upon the tests 852 conducted upon the first and second die prior to attachment 855 to the packaging substrate, the testing of the stacked die package 858 may be relatively simple.

In another determination step 860, it is determined whether the stacked die package has tested successfully. If the stacked die package passes the testing, an encapsulating layer may be applied 861, and the method terminated successfully 863. Alternately, the encapsulating layer may be omitted.

If the package does not test successfully, however, a determination is made whether the package has already been reworked 862. If the stacked die package has not previously been reworked, it is reworked 864 to correct the testing failures, such as, for example, by rewiring one or more of the first and second contact pads 110, 210 with the first and second bond pads 112, 212 respectively. The reworked die package is then returned for testing 858.

If the die package does not test successfully 860 and it has previously been reworked 862, a determination is made whether the stacked die are salvageable 866. If so, the stacked die are salvaged 868 and returned for attachment to a new packaging substrate 856, and the subsequent acts are repeated. If the stacked die are not salvageable, however, the stacked die package is discarded 870, and the method 800 is terminated 872 with an unsuccessful result.

Figure 4:
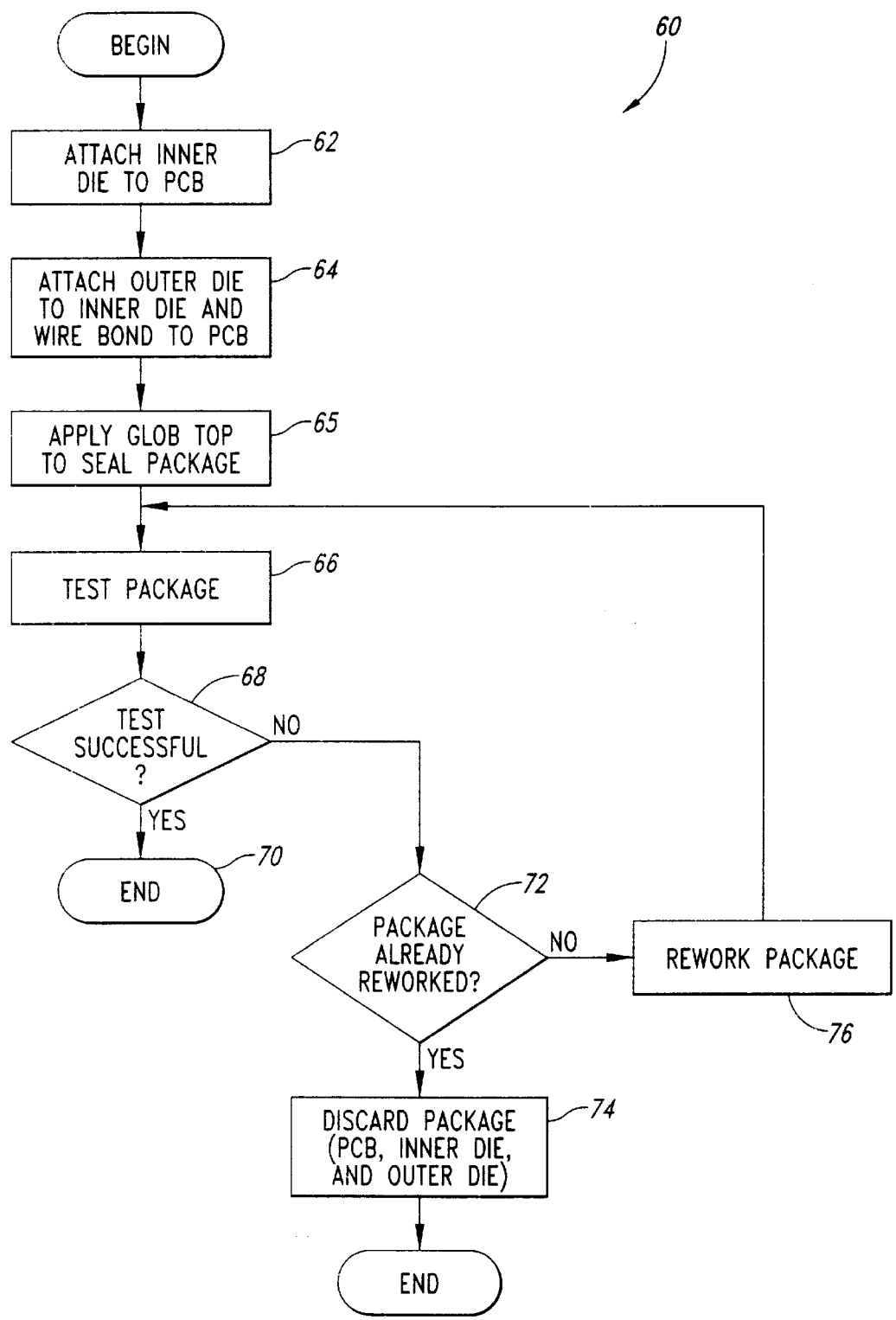
FIG. 4 is a flowchart representation of a method of packaging and testing of a stacked die package in accordance with the prior art.

Although the method of packaging and testing 800 shown in FIG. 8 involves a greater number of acts than are shown in the prior art method 60 shown in FIG. 4, the method 800 is more economical. Individual testing of the die prior to attachment to the packaging substrate simplifies the subsequent testing of the stacked die package, and makes diagnosis of test failures easier. Also, the combination of individual die testing 850 and testing of the stacked die package 858 prior to attachment to the printed circuit board improves the yield of the packaging and testing process in comparison with the prior art method 60. The method 800 reduces the effort involved in diagnosing test failures, the effort involved in reworking die packaging, and the waste and loss of production associated with discarding unsuccessful components.

Figure 9:
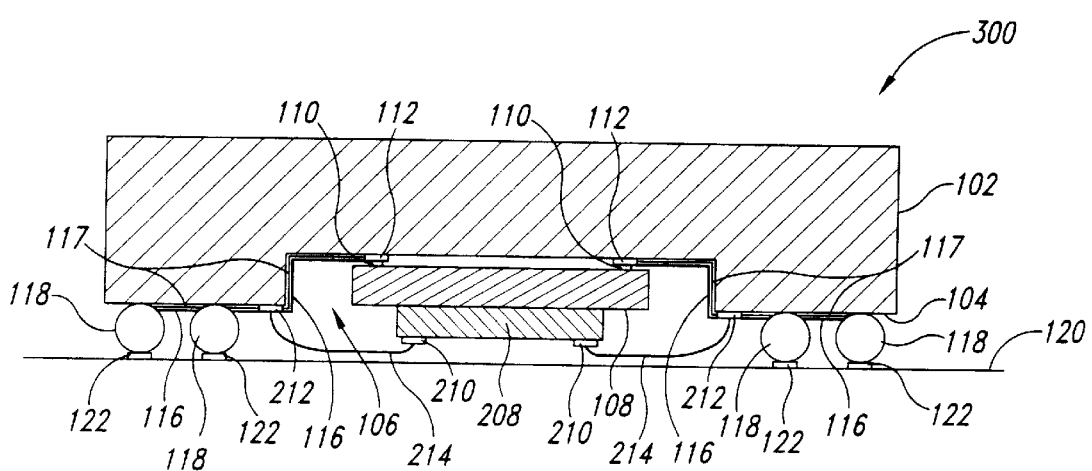
FIG. 9 is a side cross-sectional view of a stacked die package in accordance with another embodiment of the invention.

FIG. 9 is a side cross-sectional view of a stacked die package 300 in accordance with another embodiment of the invention. In this embodiment, the stacked die package 300 is similar to the previously described stacked die package 200, except that the first die 108 is coupled to the substrate 102 in a flip chip arrangement. Also, the recess 106 in this embodiment is more shallow so that the second die 208 is not fully disposed within the recess 106.

As shown in FIG. 9, the first contact pads 112 are disposed within the recess 106 of the packaging substrate 102, and the first bond pads 110 on the first die 108 are in direct contact with the first contact pads 112 on the substrate 102. Conductive leads 116 connect the first contact pads 112 with a set of solder bumps 118. The second die 208 is attached to the first die 108, and the second bond pads 210 are wirebonded to the second contact pads 212 on the lower surface 104 of the substrate 102. Conductive leads 116 also connect the second contact pads 112 with corresponding solder bumps 118 which, in turn, are engaged with the terminals 122 on the printed circuit board 120. As in the previously described embodiments, for an electrically conductive packaging substrate 102, an electrically insulative layer 117 may be formed between the conductive leads 116 and the lower surface 104. Alternately, for an electrically insulative packaging substrate 102, the electrically insulative layer 117 may be eliminated. The stacked die package 300 may be packaged and tested in accordance with the methods described above and shown on FIG. 8.

The stacked die package 300 advantageously provides the benefits of the inventive packaging arrangement, including improved thermal dissipation, physical protection, and elimination of components as described above, together with the benefits of flip chip packaging. Because the first lead wires 114 between the first bond pads 110 and the first contact pads 112 are eliminated, the electrical contact between the first die and the packaging substrate is more reliable, and the speed of the first chip is improved.

Although the stacked die package 300 is shown in FIG. 9 as having a shallow recess 106, the depth of the recess 106 may be adjusted to any desired depth in accordance with the requirements of the die package. For example, for some stacked die combinations, it may be desirable to increase the depth of the recess to situate both the first and second die within the recess. Alternately, for other applications a shallow recess may be preferred. Where a shallow recess is used, it may be necessary to increase the size of the solder bumps (or connecting pins) to increase the distance between the printed circuit board and the packaging substrate to prevent the second die 208 or the second bond wires 214 from contacting the printed circuit board 120. An encapsulating layer (see FIG. 7) may also be added to hermetically seal and protect the die, bond pads, contact pads, and bond wires.

The detailed descriptions of the above embodiments are not exhaustive descriptions of all embodiments contemplated by the inventor to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part to create additional embodiments within the scope and teachings of the invention.

Thus, although specific embodiments of, and examples for, the invention are described herein for illustrative purposes, various equivalent modifications are possible within the scope of the invention, as those skilled in the relevant art will recognize. The teachings provided herein of the invention can be applied to other apparatus and methods for packaging and testing of die, and not just to the apparatus and methods described above and shown in the figures. In general, in the following claims, the terms used should not be construed to limit the invention to the specific embodiments disclosed in the specification and the claims, but should be construed to include all apparatus and methods that operate within the broad scope of the claims. Accordingly, the invention is not limited by the foregoing disclosure, but instead its scope is to be determined by the following claims.

What is claimed is:

1. A stacked die package coupleable with a circuit board, comprising:

a packaging substrate including a first surface having a recess disposed therein and a plurality of conductive leads coupled thereto, each conductive lead having an inner end proximate the recess and an outer end coupleable with the circuit board; and a first die attached to the packaging substrate within the recess and having a plurality of first bond pads disposed thereon, each first bond pad being electrically coupled to one of the inner ends; and a second die attached to the first die and having a plurality of second bond pads disposed thereon, each second bond pad being electrically coupled to one of the inner ends, the first surface of the packaging substrate being proximate the circuit board when the outer ends are coupled with the circuit board whereby the packaging substrate at least partially encloses and protects both the first and second die.

2. The stacked die package of claim 1 wherein the outer ends of the conductive leads comprise solder bumps engageable with terminals on the circuit board.

3. The stacked die package of claim 1 wherein the outer ends of the conductive leads comprise connecting pins engageable with receptacles on the circuit board.

4. The stacked die package of claim 1 wherein at least some of the inner ends comprise first contact pads disposed within the recess, each of the first bond pads directly contacting one of the first contact pads.

5. The stacked die package of claim 1 wherein the packaging substrate comprises an electrically conductive substrate, further comprising an electrically insulative layer formed between the conductive leads and the packaging substrate.

6. The stacked die package of claim 1, further comprising an encapsulating layer disposed about the first and second die to protect the first and second die.

7. The stacked die package of claim 1 wherein the second die is fully disposed within the recess.

8. The stacked die package of claim 1 wherein the first die is a flip chip mounted die and the second bond pads are wire-bonded to the inner ends of the conductive leads.

9. The stacked die package of claim 1 wherein the packaging substrate has a plurality of via formed therethrough, at least some of the conductive leads being at least partially disposed within the plurality of via.

10. The stacked die package of claim 9 wherein the packaging substrate comprises an electrically conductive substrate, further comprising an electrically insulative layer formed between the conductive leads and the packaging substrate.

11. The stacked die package of claim 9 wherein each outer end comprises a ball pad coupleable with a conductive bump.

12. The stacked die package of claim 11, further comprising a conductive bump formed on each ball pad and engageable with terminals on the circuit board.

13. The die package of claim 1 wherein at least some of the inner ends comprise contact pads disposed within the recess, each of the first bond pads directly contacting one of the contact pads.

14. A stacked die package coupleable with a circuit board, comprising:

a packaging substrate including a first surface having a recess disposed therein and a plurality of conductive leads formed thereon, each conductive lead having an inner end proximate the recess and an outer end coupleable with the circuit board;

a first die attached to the packaging substrate within the recess and having a plurality of first bond pads disposed thereon, each first bond pad being electrically coupled to one of the inner ends; and a second die attached to the first die and having a plurality of second bond pads disposed thereon, each second bond pad being electrically coupled to one of the inner ends, the first surface of the packaging substrate being proximate the circuit board when the outer ends are coupled with the circuit board.

15. The die package of claim 14 wherein the outer ends of the conductive leads comprise solder bumps engageable with terminals on the circuit board.

16. The die package of claim 14 wherein the outer ends of the conductive leads comprise connecting pins engageable with receptacles on the circuit board.

* * * * *

UNITED STATES PATENT AND TRADEMARK OFFICE
CERTIFICATE OF CORRECTION

PATENT NO. : 6,294,839 B1
DATED : September 25, 2001
INVENTOR(S) : Leonard E. Mess et al.

Page 1 of 1

It is certified that error appears in the above-identified patent and that said Letters Patent is hereby corrected as shown below:

Column 9,
Lines 40 and 42, "via" should read -- vias --

Column 10,
Line 30, "each-second" should read -- each second --

Signed and Sealed this

Twenty-first Day of May, 2002

Attest:

Attesting Officer

JAMES E. ROGAN
Director of the United States Patent and Trademark Office